United States Patent
Mattson

(10) Patent No.: US 10,261,111 B1
(45) Date of Patent: Apr. 16, 2019

(54) OSCILLOSCOPE WITH DIGITAL SEARCH TRIGGERING

(71) Applicant: Keysight Technologies, Inc., Minneapolis, MN (US)

(72) Inventor: Colin Mattson, Colorado Springs, CO (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 61 days.

(21) Appl. No.: 15/235,343

(22) Filed: Aug. 12, 2016

(51) Int. Cl.
*G01R 13/02* (2006.01)

(52) U.S. Cl.
CPC .............................. *G01R 13/0254* (2013.01)

(58) Field of Classification Search
CPC .................................................. G01R 13/0254
See application file for complete search history.

(56) References Cited

U.S. PATENT DOCUMENTS

| 4,743,844 A * | 5/1988 | Odenheimer .......... G01R 13/22 324/115 |
| 2015/0066409 A1 * | 3/2015 | Duff ................... G01R 13/0236 702/67 |

* cited by examiner

*Primary Examiner* — Manuel A Rivera Vargas

(57) ABSTRACT

An oscilloscope includes a probe and an analog to digital converter. The probe detects a varying electronic signal and produces an analog signal. The analog to digital converter converts the analog signal to a digital signal. The oscilloscope detects vertical movement of the digital signal as a first digital trigger triggered at a trigger time. A segment of the digital signal is compared with predetermined parameters for the varying electronic signal received from a user to confirm whether a pattern of the varying electronic signal in the segment matches the predetermined parameters. When the pattern of the varying electronic signal in the segment matches the predetermined parameters, the process includes generating a display showing the varying electronic signal in the segment based on the trigger time.

19 Claims, 8 Drawing Sheets

OSCILLOSCOPE WITH DIGITAL SEARCH TRIGGERING

BACKGROUND

An oscilloscope is a device for measuring oscillations of a variable electronic signal for display on a screen by measuring the variable electronic signals with a probe and using an analog trigger system to determine which portions of the variable electronic signals to display. An oscilloscope may use the probe to produce an analog signal based on the varying electronic signal, and then use the analog trigger to determine which portions of the analog signal to display.

An oscilloscope may be capable of acquiring the variable electronic signal up to bandwidths of, for example, ~67 Gigahertz. However, analog trigger systems today may not be generally capable of triggering on bandwidths beyond ~3 Gigahertz, with the exception of analog trigger systems capable of triggering on bandwidths to ~20 Gigahertz but only based on rising-edge and falling-edge trigger modes. As a result, triggering is not available for a large portion of the available acquisition bandwidth of modern oscilloscopes (i.e., that offer acquisition bandwidth up to ~67 Gigahertz).

Additionally, some modern oscilloscopes offer software-qualified trigger options. In such oscilloscopes, an analog trigger is still used to initiate the conversion of the analog signal to a 2-dimensional digital signal to run through the software-qualified trigger software. The software-qualified trigger uses a software algorithm to analyze a segment of the 2-dimensional digital signal. The software-qualified trigger verifies the analog trigger based on criteria entered by a user. As noted, however, analog trigger systems have bandwidth constrained to only the lowest portion of the acquisition bandwidth of a modern oscilloscope. Moreover, software-qualified triggers can only analyze acquired data, so any would-be trigger event that occurs between acquisitions based on analog triggers, or on the acquisition time boundary, will be missed.

Moreover, software-qualified triggers that follow analog triggers require software post-processing after each acquisition based on the analog trigger. Depending on trigger conditions, many acquisitions will not pass the software-qualification and verify the analog trigger. Therefore, software-qualified trigger modes based on analog triggers are known to drastically reduce verified trigger rates.

As one final example, a manufacturer now provides a full digital trigger system (i.e., without using any underlying analog trigger) for an oscilloscope up to ~4 Gigahertz. However, as with all of the other trigger systems mentioned above, this is not useful for any acquisition system now capable of acquiring in bandwidths up to ~67 Gigahertz and even higher.

Therefore, some modern analog triggers are known to be fully functional to ~3 Gigahertz, and others to be partly functional to ~20 Gigahertz. Full digital triggering (i.e., without using any underlying analog trigger) is not currently available beyond ~4 Gigahertz. As noted, acquisition bandwidth of a modern oscilloscopes may be up to ~67 Gigahertz and even beyond. Acquisition bandwidth for an oscilloscope is projected to reach above 100 Gigahertz in the near future.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
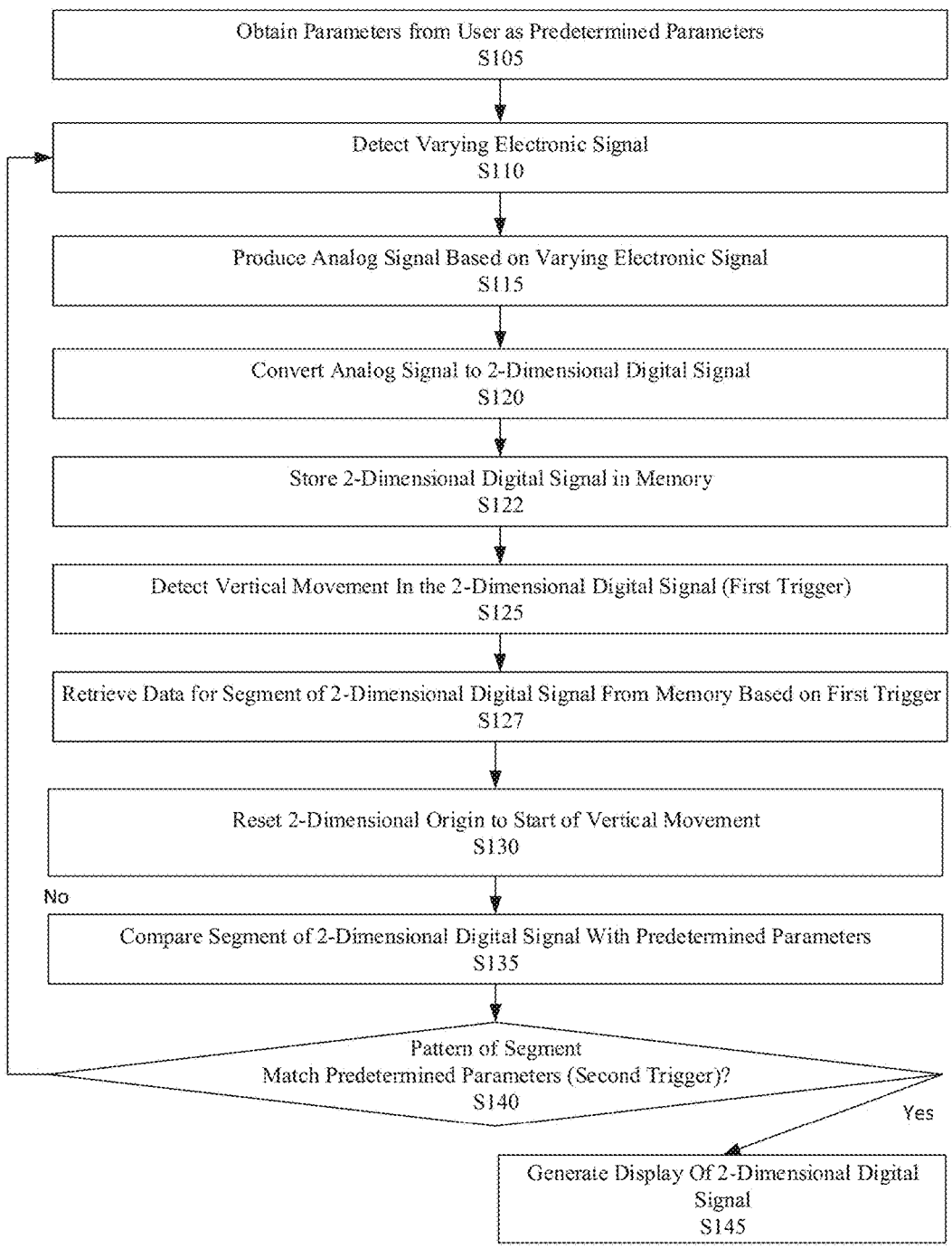
FIG. 1 is a representative view of a process for an oscilloscope with digital search triggering, in accordance with a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the inventive concept.

The terminology used herein is for purposes of describing particular embodiments only, and is not intended to be limiting. As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

In view of the foregoing, the present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

DESCRIPTION OF FIGURES

According to the representative figures described below, analog-like trigger configuration options are provided for substantially the entire acquisition bandwidth of an oscilloscope with digital search triggering. However, as will be made clear, even when the oscilloscope with digital search triggering has an analog triggering capability, the analog triggering capability need not be used insofar as digital triggers can be solely used by the oscilloscope with digital search triggering described herein.

FIG. 1 is a representative view of a process for the oscilloscope with digital search triggering, in accordance with a representative embodiment. In FIG. 1, parameters are obtained from a user as predetermined parameters at S105. The user may input parameters to the oscilloscope with digital search triggering to set triggers for selecting a portion of a varying electronic signal to display ultimately on a screen of the oscilloscope with digital search triggering. The varying electronic signal varies such as by having varying amplitudes over time. Further, the varying electronic signal may include multiple components carried over different frequency spectrums or channels, so that the different components can be measured on the different frequency spectrums or channels.

The parameters may be entered on a user interface of the oscilloscope with digital search triggering, using knobs, buttons, a mouse, a keyboard, or other forms of user input mechanisms. Alternatively, the parameters can be input via another device connected over a link or network to the oscilloscope with digital search triggering.

The parameters obtained from the user can include, for example, a minimum time, a maximum time, a minimum vertical movement threshold, a maximum vertical movement threshold, a minimum amplitude, and a maximum amplitude, each of which can be used to characterize, for example, electronic signal pulses sought by the user inputting the parameters. For example, a vertical movement threshold is a single scalar quantity in Volts. A vertical movement threshold may specify a minimum amount of movement from an offset, and/or whether, for example, a pulse moves beyond a level corresponding to the minimum amount of movement and then back within the level. Thus, vertical movement as the term is used herein may include any of, for example:

A minimum amount of movement above an offset may be detected as vertical movement.

A minimum amount of movement below an offset may be detected as vertical movement.

Vertical movement can be detected based on whether movement exceeds a level corresponding to a minimum amount of movement.

Vertical movement can be detected based on whether movement exceeds a level corresponding to a minimum amount of movement, and then returns to within the same level.

Although the present disclosure mainly describes using parameters for a pulse, the teaching described herein are not limited to detecting pulses. Rather, the parameters that can be entered by a user for an oscilloscope with digital search triggering are based on analog trigger modes which can be used to capture any kind of signal behavior, and not just pulses. Several forms of triggering described herein with respect to FIG. 5 include Pulse Width (Glitch), Runt, Timeout, and Edge Transition. Each of these forms of triggering is described herein, and these are only representative of the various forms of triggering that are similar to previous analog triggering. The varying electronic signals that may contain, for example, pulses, are captured when a probe of the oscilloscope with digital search triggering is attached to, connected to, or otherwise used to capture the varying electronic signal in the medium through which the varying electronic signal passes. The medium may be, for example, a communications link such as a cable. The oscilloscope with digital search triggering described herein is capable of scanning through thousands of acquired waveforms per second, and when the probe is used to capture the varying electronic signal, the oscilloscope with digital search triggering may be continually converting analog signals from the probe to digital data that can be used to generate one or more triggers.

At S110, a varying electronic signal is detected. The varying electronic signal includes the varying electronic signal pulses or other characteristics noted above, and is detected at S110 using the probe of the oscilloscope with digital search triggering when the probe is attached to, connected to, or otherwise used to capture the varying electronic signal in the medium. The detecting at S110 may include measuring levels of the varying electronic signal.

At S115, an analog signal is produced based on the detected varying electronic signal. The analog signal may be a representation of levels and other characteristics of the varying electronic signal. The analog signal produced at S115 may be continuously produced for all, most, or only a part of the bandwidth spectrum detectable by the oscilloscope with digital search triggering used for the detecting at S110.

At S120, the analog signal is converted to a 2-dimensional digital signal. The 2-dimensions of the 2-dimensional digital signal may be time and signal magnitude, and may be measurements of, for example, voltage of the varying electronic signal passing through the medium over time. The conversion to a 2-dimensional digital signal at S120 may be continuously performed for all, most, or only a part of the bandwidth spectrum detectable by the oscilloscope with digital search triggering used for the conversion at S120. The conversion at S120 may be subject to constraints imposed by, for example, the sampling rate of the oscilloscope with digital search triggering.

Additionally, the part of the bandwidth spectrum detectable by the oscilloscope with digital search triggering may vary by the capabilities of the oscilloscope with digital search triggering. For example, a customer may be able to obtain an improved bandwidth spectrum detection capability for an existing oscilloscope from the manufacturer of the oscilloscope with digital search triggering. In this way a customer may be able to improve detection from 50 Gigahertz up to 70 Gigahertz, for example.

At S122, the 2-dimensional digital signal is stored in a memory of the oscilloscope with digital search triggering. The data stored in the memory may be the full amount of data of the converted 2-dimensional digital signal, and include at least enough data to populate a screen of the oscilloscope with digital search triggering.

At S125, vertical movement in the 2-dimensional digital signal is detected as a first trigger. The 2-dimensional digital signal is analyzed for such vertical movement, and the data analyzed to detect the vertical movement may be much less detailed than the full amount of data stored in the memory at S122. The vertical movement may be, for example a leading edge or a trailing edge of, for example, a pulse in the 2-dimensional digital signal. The vertical movement may be indicated or confirmed based on a minimum level of movement, either considered alone, or over time. For example, a leading edge may be confirmed after a 0.5 (one half) volt rise in the signal is confirmed for 10 (ten) nanoseconds. As another example, a trailing edge may be confirmed after a 0.5 (one half) volt drop, regardless of the timeframe. The analysis at S125 may be described by a variety of terms in relation to the 2-dimensional digital signal, including:

The analysis at S125 may include a search for vertical movement in the 2-dimensional digital signal based on preset parameters.

The analysis at S125 may include filtering data in the 2-dimensional digital signal to identify vertical movement based on preset parameters.

The data used to search for vertical movement in the 2-dimensional may be less than the full amount of data stored in the memory at S122. In any event, in order to perform a comparison at S135 below, and in order to allow the origin of the 2-dimensional digital signal to be reset at S130 below, a complete amount of data for a segment of the 2-dimensional digital signal stored in the memory at S122 is retrieved. As noted, the data stored in the memory may be the full amount of data of the converted 2-dimensional digital signal, and include at least enough data to populate a screen of the oscilloscope with digital search triggering.

At S130, the origin of the 2-dimensional digital signal is reset to t=0 at a time relative to a start of the vertical movement. The origin may be reset at the identified start of the vertical movement, a middle of the vertical movement, an identified end of the vertical movement, or after a threshold time or level has passed after the identified start of the vertical movement. The resetting of the origin may be performed, for example, to re-center a screen on which the 2-dimensional digital signal is to be displayed. Because the full amount of data for the segment is retrieved at S122, even portions of the segment that occurred timewise before the first trigger are retrieved for display. As explained herein and shown in, for example FIGS. 3 and 4, this way a full segment can reflect the part of the detected varying electronic signal that occurred before, for example, a pulse that is detected by the vertical movement, as well as the part of the detected varying electronic signal after the trigger.

At S135, a segment of the 2-dimensional digital signal is compared with the predetermined parameters set at S105. The segment is centered at the vertical movement time set at S130 (i.e., centered at the start, middle, end, or after a threshold time or level from the start of vertical movement). As noted, the predetermined parameters may be, for example, a minimum time, maximum time, a minimum vertical movement threshold, a maximum vertical movement threshold, minimum amplitude, maximum amplitude, and so on. Additionally, while centering of the segments is described herein, the segment may be set in other ways, such as starting from the trigger time, or offset from the trigger time or the location of the detected vertical movement by a predetermined amount of time. Thus, the segment is determined based on the trigger time, and in the present disclosure is predominantly described as being centered based on the trigger time.

In plain terms, the user may be looking, for example, for particular pulses in the varying electronic signal as represented by the 2-dimensional digital signal. The comparison at S135 is performed to identify which segments of the 2-dimensional digital signal to display. In other words, the comparison at S135 is used to filter results from the first trigger at S125, as not every identified leading edge or falling edge will be of interest to the user.

At S140, a determination is made as to whether a pattern of the segment compared at S135 matches the predetermined parameters. This determination is a second trigger in the process of FIG. 1. If the pattern of the segment matches the predetermined parameters (S140=Yes), the display of the 2-dimensional digital signal including at least the segment is generated at S145. The display is generated on a screen of the oscilloscope with digital search triggering as described herein. The display shows the segment of the 2-dimensional digital signal that is based on the underlying varying electronic signal.

The displayed segment at S145 reflects two triggers, i.e., both at S125 by vertical movement detected in the 2-dimensional digital signal, and at S140 by the pattern confirmed in the 2-dimensional digital signal based on the user's predetermined parameters. As should be clear from FIG. 1, both triggers are digital. The detected varying electronic signal in as much as the entirety of the bandwidth that can be acquired by the oscilloscope with digital search triggering may be subject to digitization before S125 and S140. Limitations on the bandwidth usable for triggering at S125 and S140 can be imposed by sampling rates, a type of the oscilloscope with digital search triggering used for the process in FIG. 1, and so on, but not by limitations such as those otherwise imposed by analog triggers.

If the pattern of the segment does not match the predetermined parameters (S140=No), the process returns to S110 where the varying electronic signal is detected. Of course, the varying electronic signal can be detected at S110 the entire time during which the process from S115 to S140 occurs, such that various actions in FIG. 1 can occur simultaneously for a single varying electronic signal.

An oscilloscope with digital triggering that performs logical processes in FIG. 1 such as S125, S135 and S140 may include circuitry such as a circuit with processors and memories as described herein. A memory can store preset instructions such as a software program, and a processor can execute the instructions in order to analyze data from a 2-dimensional digital. The analysis of obtained data in accordance with preset instructions executed by processors is an example of how to provide the first trigger and second trigger described herein.

Figure 2:
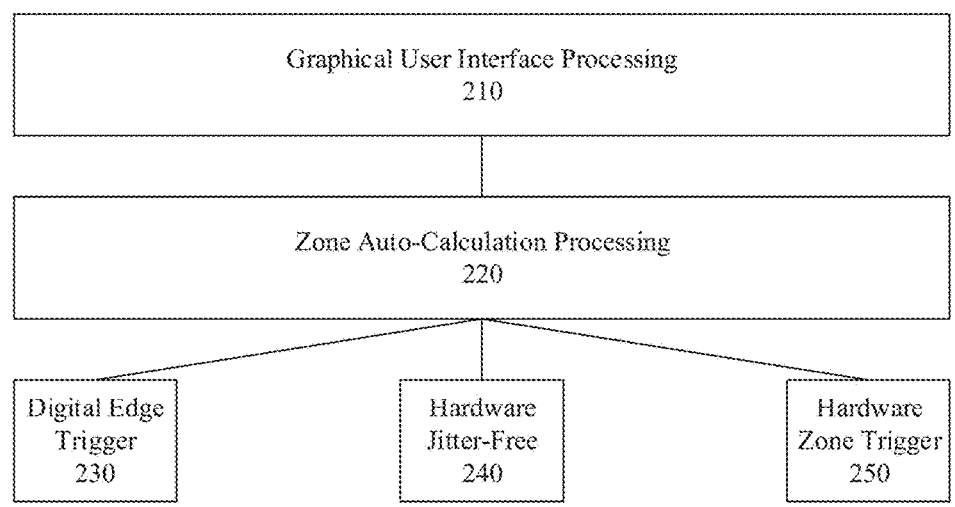
FIG. 2 is a representative overview of an oscilloscope with digital search triggering, in accordance with a representative embodiment.

FIG. 2 is a representative overview of the oscilloscope with digital search triggering, in accordance with a representative embodiment. In FIG. 2, three different aspects of the oscilloscope with digital search triggering are shown as the underlying layer. These three elements are digital edge trigger 230, hardware jitter-free 240, and hardware zone trigger 250. Each of these aspects of the oscilloscope with digital search triggering is described below.

The digital edge trigger 230 is for a real-time oscilloscope. The digital edge trigger may be provided in a memory control application specific integrated circuit (ASIC), and is asynchronous and provides rising-edge and falling-edge triggering for a 2-dimensional digital signal. The digital edge trigger 230 is the first trigger, and corresponds to the detection of vertical movement at S125 in FIG. 1. In the embodiment of FIG. 2, the digital edge trigger 230 provides triggering for substantially the entirety of the acquisition bandwidth of the oscilloscope with digital search triggering. This acquisition bandwidth may be, for example, up to ~67 Gigahertz, or up to or beyond ~100 Gigahertz.

The hardware jitter-free 240 may be provided by executing software in the oscilloscope with digital search triggering. Hardware jitter-free 240 is able to time-align a segment edge horizontally prior to, for example, a zone trigger analysis (at, e.g., S140 and S145 in FIG. 1), and may be particularly important when zones are horizontally and vertically fixed. The hardware jitter-free provides alignment of the trigger point of a 2-dimensional digital signal segment horizontally on a screen at t=0. The hardware jitter-free 240 may also be provided via hardware so as to use a dedicated hardware resource (chip or circuitry) to align segments at t=0 on screens faster than is possible with software executed by a processor with numerous different responsibilities.

The hardware zone trigger 250 is a dedicated hardware resource that provides a zone trigger analysis to confirm the first trigger from the digital edge trigger 230. The hardware zone trigger 250 increases the triggering over a software zone trigger, insofar as the dedicated hardware resource (chip or circuitry) is faster than software executed by a processor with numerous different responsibilities.

Use of the digital edge trigger 230, hardware jitter-free 240 and hardware zone trigger 250 enable and improve the performance of the oscilloscope with digital search triggering. In FIG. 2, zone auto-calculation processing 220 is used to enhance parameters input by a user. For example, if a user provides analog parameters for an analog signal, zone auto-calculation processing 220 can be used to transform the analog parameters to digital parameters comparable with the 2-dimensional digital signal at S135 in FIG. 1. Thus, the zone auto-calculation processing 220 can be used to extend the functionality of advanced analog trigger modes beyond the bandwidth of an analog trigger system, all the way to the acquisition bandwidth of the scope. This extension of functionality is achieved by automatically configuring the zones based on user-input in, for example, a triggering setup dialog used by a user on current oscilloscopes to input analog parameters.

Figure 3:
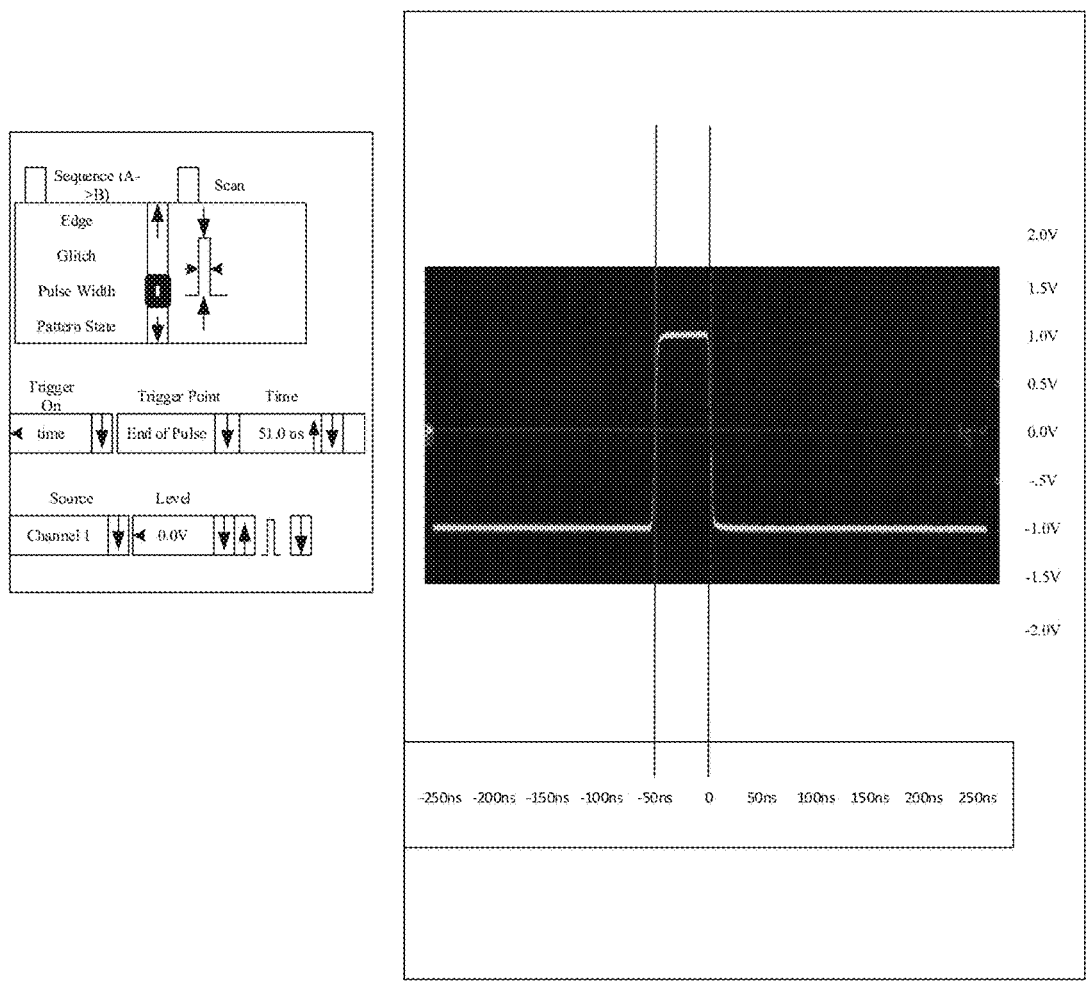
FIG. 3 is a representative user interface for an oscilloscope with digital search triggering, in accordance with a representative embodiment.
Figure 4:
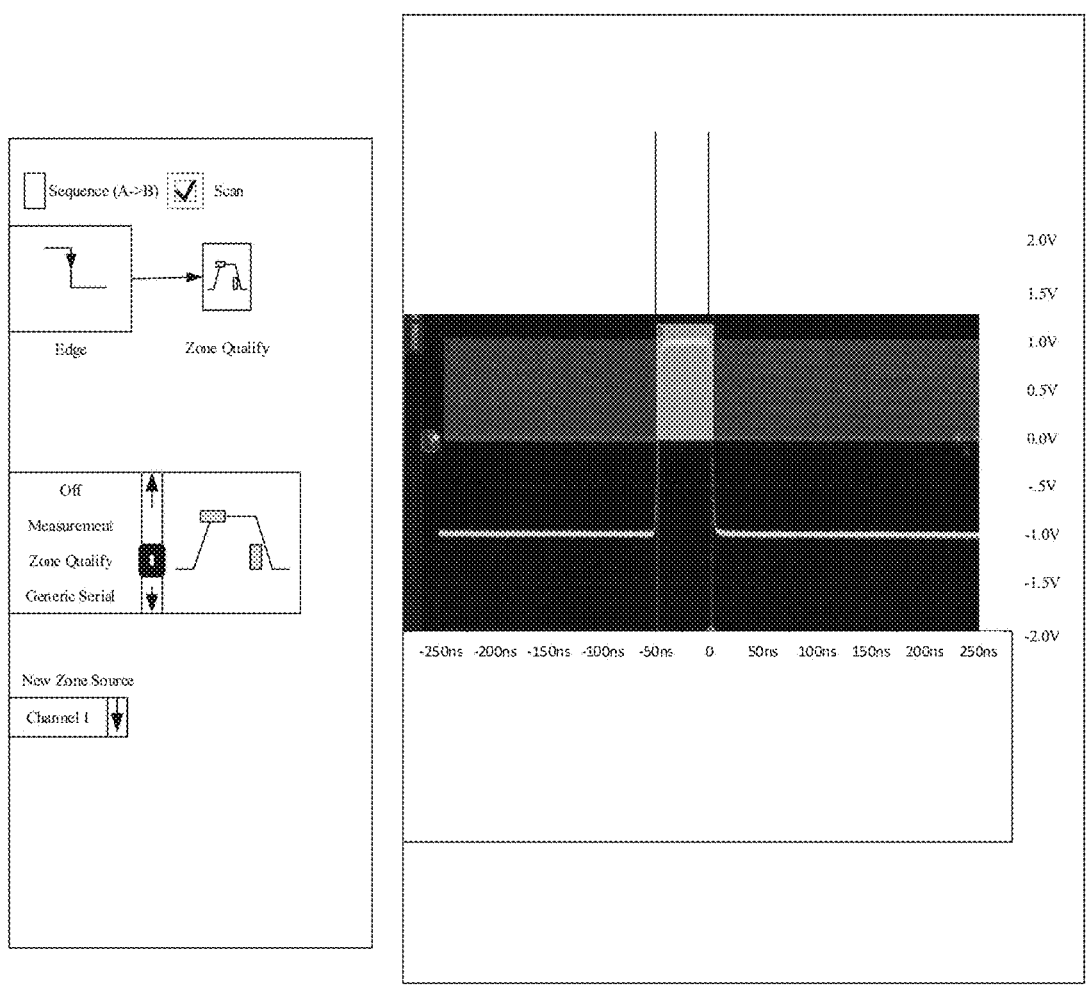
FIG. 4 is a representative user interface for an oscilloscope with digital search triggering, in accordance with a representative embodiment.

Additionally, graphical user interface processing 210 is used to actually generate the display of the 2-dimensional digital signal segment at S145. The graphical user interface processing 210 can be used to generate a display as shown in FIGS. 3 and 4, where "zones" are highlighted in a color such as yellow. The display will provide a horizontal center at t=0 to start at the leading or falling edge which triggered the first trigger at S125, such that the segment being compared is centered based on the location of the detected vertical movement. As noted already, the origin may be reset at the identified start of the vertical movement, a middle of the vertical movement, an identified end of the vertical movement, or after a threshold time or level has passed after the identified start of the vertical movement. The resetting of the origin may be performed, for example, to re-center a graphical user interface on which the 2-dimensional digital signal is to be displayed.

A trigger may be generated when an electronic signal enters a zone. However, a trigger may also be generated based on predetermined criteria when an electronic signal leaves the zone. Moreover, a trigger may be generated when an electronic signal does not enter any zone. Additionally, a trigger may be generated when an electronic enters a first zone without entering a second zone, or leaves a first zone without leaving a second zone. That is, zones may be used to define complex triggers. Thus, the second trigger may be generated based on whether an electronic signal crosses a zone boundary.

FIG. 3 is a representative user interface for the oscilloscope with digital search triggering, in accordance with a representative embodiment. In the example shown in the view of FIG. 3, parameters for width >50 ns (greater than fifty nanoseconds) and positive polarity (amplitude greater than zero) are set to identify pulses. The pulse is identified at the end of the pulse, after the width is confirmed along with the polarity. As shown in FIG. 3, the origin of the screen (i.e., t=0) is set to the falling edge of the pulse. Additionally, the significance of the positive polarity can be seen insofar as the signal before and after the pulse is ~−1 volt (approximately minus one volt), such that an amplitude measurement that is positive is relatively noteworthy. The pulse shown in the user interface in FIG. 3 is configured using analog settings of the oscilloscope with digital search triggering.

FIG. 4 is a representative user interface for the oscilloscope with digital search triggering, in accordance with a representative embodiment. In FIG. 4, a pulse shown on the user interface is configured using digital settings of the oscilloscope with digital search triggering. In FIG. 4, zones are defined to again show a minimum voltage level of 0 (zero), i.e., positive polarity, and the width greater than 50 nanoseconds. In FIG. 4, the zone based on the parameters is shaded as a rectangular box above 0 volts, and between −50 nanoseconds and 0 nanoseconds.

Figure 5:
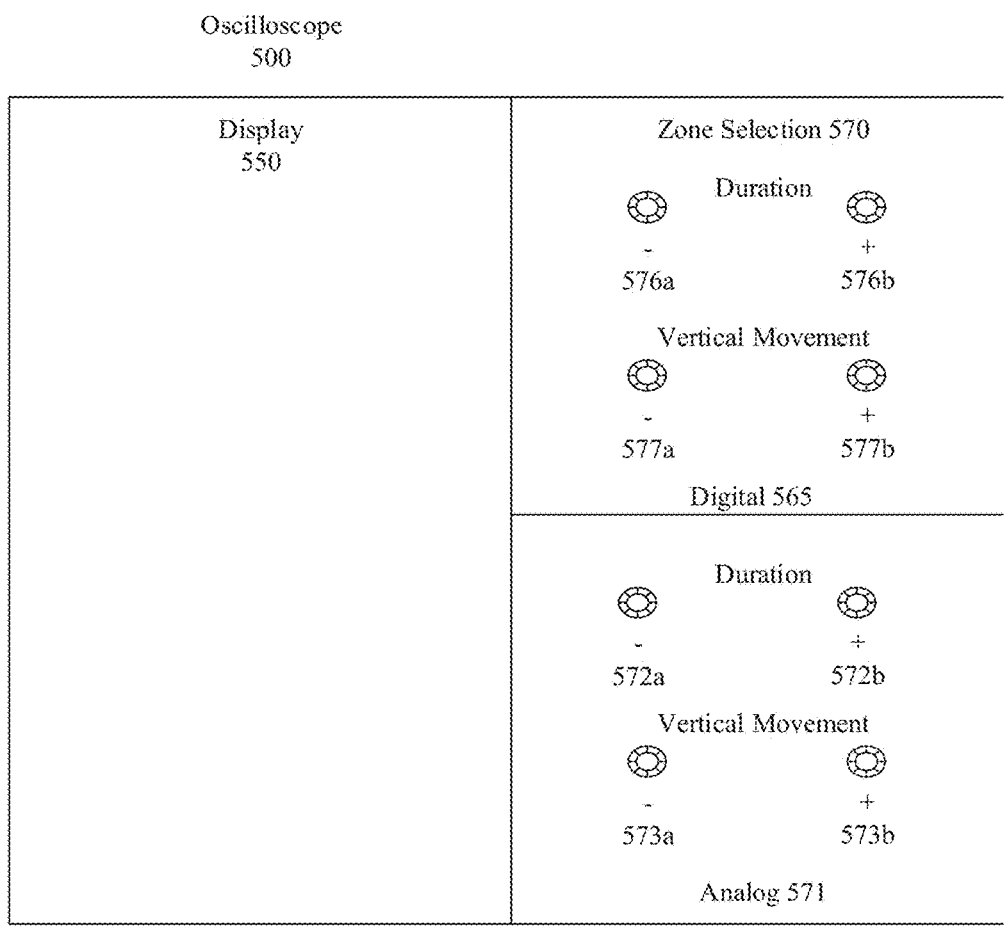
FIG. 5 is a representative user interface for an oscilloscope with digital search triggering, in accordance with a representative embodiment.

FIG. 5 is a representative user interface for the oscilloscope with digital search triggering, in accordance with a representative embodiment. In FIG. 5, the oscilloscope 500 with digital search triggering includes display 550. The representation of segments of 2-dimensional digital signals can be shown on the display 550.

In FIG. 5, analog inputs are provided in analog section 571. The analog inputs include two inputs for duration (width) 572a and 572b, and two inputs for amplitude (voltage) 573a and 573b.

Additionally, in FIG. 5, digital inputs are provided in section 570. The digital inputs include two inputs for duration (width) 576a and 576b, and two inputs for amplitude (voltage) 577a and 577b.

Using a user interface for the oscilloscope 500 with digital search triggering shown in FIG. 5, a user can enter inputs to identify which segments of an electronic signal should be used to generate a display on the display 550. Each input 572a, 572b, 573a, 573b 576a, 576b, 577a, 577b may be a dial as shown in FIG. 5. Alternatively, each input 572a, 572b, 573a, 573b 576a, 576b, 577a, 577b may accept digital input using, for example, a numeric keypad. Additionally, any input in FIG. 5 or other embodiments described herein may be other known input mechanisms, including for example soft buttons on a touch screen.

Using a user interface of the oscilloscope 500 with digital search triggering as shown in FIG. 5, known advanced trigger modes can be set by a user. The modes that can be set using the oscilloscope with digital search triggering include:

Pulse Width (Glitch): Pulse Width (Glitch) triggering sets oscilloscope 500 with digital search triggering to trigger on a positive or negative pulse of a specified width, such as when a pulse width is less than a specified amount of time.

Runt: Runt triggering sets oscilloscope 500 with digital search triggering to trigger on a pulse that does not reach a threshold high or low level, such as when pulses are expected to reach 2.0 volts and an anomaly runt pulse only reaches 1.5 volts.

Timeout: Timeout triggering sets oscilloscope 500 with digital search triggering to trigger when a signal remains either above or below a specified vertical threshold for greater than a specified amount of time since previously crossing the specified vertical threshold.

Edge Transition: Edge Transition triggering sets oscilloscope 500 with digital search triggering to trigger on a rising or falling edge that violates a specified threshold for a rise time or fall time, such as by rising or falling slower or faster than specified by predetermined parameters.

Many other types of trigger modes may be offered by oscilloscope 500 with digital search triggering, and fall within the scope of the second digital triggers described herein so long as they are used as secondary triggers for a 2-dimensional digital signal as otherwise described herein.

In an embodiment, the user interface of an oscilloscope 500 with digital search triggering may use checkboxes such as "extended bandwidth" for a user to check in a trigger mode setup dialog. The user can check "extended bandwidth" for triggering for each of the modes such as those described above. Additionally, or alternatively, the zone options may be shown for each of the supported modes, and offered with an "auto-zone-setup" in the trigger mode setup dialog. Using a zone auto-calculation processing 220 as described above, the oscilloscope 500 with digital search triggering can approximate an analog trigger mode using the hardware zone trigger 250.

Figure 6:
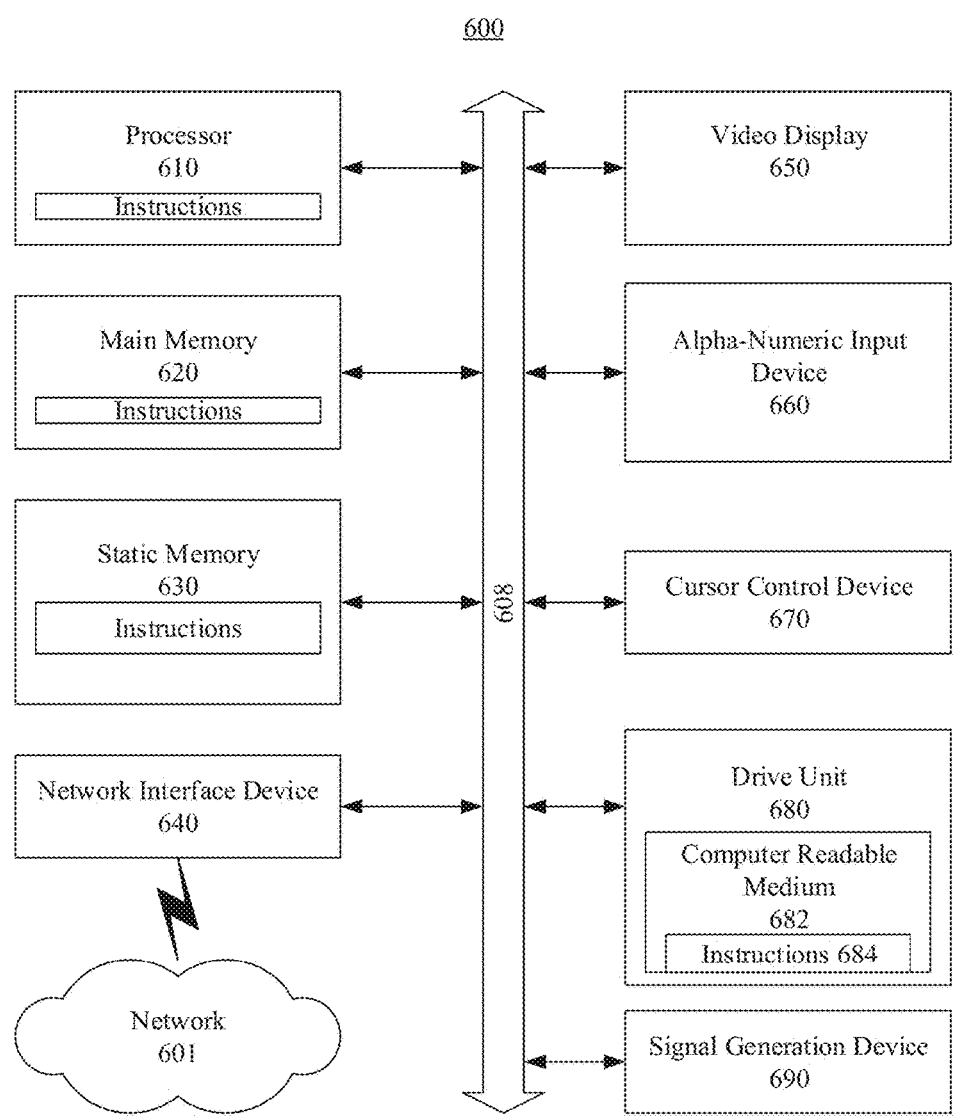
FIG. 6 is a representative device architecture for an oscilloscope with digital search triggering, in accordance with a representative embodiment.

FIG. 6 is a representative device architecture for the oscilloscope with digital search triggering, in accordance with a representative embodiment. The representative device architecture for the oscilloscope with digital search triggering is shown and is designated computer system 600. The computer system 600 can include a set of instructions that can be executed to cause the computer system 600 to perform any one or more of the methods or computer based functions disclosed herein. The computer system 600 may operate as a standalone device or may be connected, for example, using a network 601, to other computer systems or peripheral devices.

In a networked deployment, the computer system 600 may operate in the capacity of a server or as a client user computer in a server-client user network environment, or as a peer computer system in a peer-to-peer (or distributed) network environment. The computer system 600 is implemented as or incorporated into the oscilloscope with digital search triggering 600 or an equivalent or successor device with analogous capabilities including the ability to execute a set of instructions (sequential or otherwise) that specify actions to be taken by the device. The computer system 600 can be incorporated as or in a particular device that in turn is in an integrated system that includes additional devices. In a particular embodiment, the computer system 600 can be implemented using the oscilloscope with digital search triggering that provide audio, video and/or data communication. Further, while a single computer system 600 is illustrated, the term "system" shall also be taken to include any collection of systems or sub-systems that individually or jointly execute a set, or multiple sets, of instructions to perform one or more computer functions.

As illustrated in FIG. 6, the computer system 600 includes a processor 610. A processor for a computer system 600 is tangible and non-transitory. As used herein, the term "non-transitory" is to be interpreted not as an eternal characteristic of a state, but as a characteristic of a state that will last for a period of time. The term "non-transitory" specifically disavows fleeting characteristics such as characteristics of a particular carrier wave or signal or other forms that exist only transitorily in any place at any time. A processor is an article of manufacture and/or a machine component. A processor for a computer system 600 is configured to execute software instructions in order to perform functions as described in the various embodiments herein. A processor for a computer system 600 may be a general purpose processor or may be part of an application specific integrated circuit (ASIC). A processor for a computer system 600 may also be a microprocessor, a microcomputer, a processor chip, a controller, a microcontroller, a digital signal processor (DSP), a state machine, or a programmable logic device. A processor for a computer system 600 may also be a logical circuit, including a programmable gate array (PGA) such as a field programmable gate array (FPGA), or another type of circuit that includes discrete gate and/or transistor logic. A processor for a computer system 600 may be a central processing unit (CPU), a graphics processing unit (GPU), or both. Additionally, any processor described herein may include multiple processors, parallel processors, or both. Multiple processors may be included in, or coupled to, a single device or multiple devices.

Moreover, the computer system 600 includes a main memory 620 and a static memory 630 that can communicate with each other via a bus 608. Memories described herein are tangible storage mediums that can store data and executable instructions, and are non-transitory during the time instructions are stored therein. As used herein, the term "non-transitory" is to be interpreted not as an eternal characteristic of a state, but as a characteristic of a state that will last for a period of time. The term "non-transitory" specifically disavows fleeting characteristics such as characteristics of a particular carrier wave or signal or other forms that exist only transitorily in any place at any time. A memory described herein is an article of manufacture and/or machine component. Memories described herein are computer-readable mediums from which data and executable instructions can be read by a computer. Memories as described herein may be random access memory (RAM), read only memory (ROM), flash memory, electrically programmable read only memory (EPROM), electrically erasable programmable read-only memory (EEPROM), registers, a hard disk, a removable disk, tape, compact disk read only memory (CD-ROM), digital versatile disk (DVD), floppy disk, blu-ray disk, or any other appropriate form of storage medium known in the art. Memories may be volatile or non-volatile, secure and/or encrypted, unsecure and/or unencrypted.

As shown, the computer system 600 may further include a video display unit 650, such as a liquid crystal display (LCD), an organic light emitting diode (OLED), a flat panel display, a solid state display, or a cathode ray tube (CRT). Additionally, the computer system 600 may include an input device 660, such as a keyboard/virtual keyboard or touch-sensitive input screen or speech input with speech recognition, and a cursor control device 670, such as a mouse or touch-sensitive input screen or pad. The computer system 600 can also include a disk drive unit 680, a signal generation device 690, such as a speaker or remote control, and a network interface device 640.

In a particular embodiment, as depicted in FIG. 6, the disk drive unit 680 may include a computer-readable medium 682 in which one or more sets of instructions 684, e.g. software, can be embedded. Sets of instructions 684 can be read from the computer-readable medium 682. Further, the instructions 684, when executed by a processor, can be used to perform one or more of the methods and processes as described herein. In a particular embodiment, the instructions 684 may reside completely, or at least partially, within the main memory 620, the static memory 630, and/or within the processor 610 during execution by the computer system 600.

In an alternative embodiment, dedicated hardware implementations, such as application-specific integrated circuits (ASICs), programmable logic arrays and other hardware components, can be constructed to implement one or more of the methods described herein. One or more embodiments described herein may implement functions using two or more specific interconnected hardware modules or devices with related control and data signals that can be communicated between and through the modules. Accordingly, the present disclosure encompasses software, firmware, and hardware implementations. Nothing in the present application should be interpreted as being implemented or implementable solely with software and not hardware such as a tangible non-transitory processor and/or memory.

In accordance with various embodiments of the present disclosure, the methods described herein may be implemented using a hardware computer system that executes software programs. Further, in an exemplary, non-limited embodiment, implementations can include distributed processing, component/object distributed processing, and parallel processing. Virtual computer system processing can be constructed to implement one or more of the methods or functionality as described herein, and a processor described herein may be used to support a virtual processing environment.

The present disclosure contemplates a computer-readable medium 682 that includes instructions 684 or receives and executes instructions 684 responsive to a propagated signal; so that a device connected to a network 601 can communicate voice, video or data over the network 601. Further, the instructions 684 may be transmitted or received over the network 601 via the network interface device 640.

Figure 7:
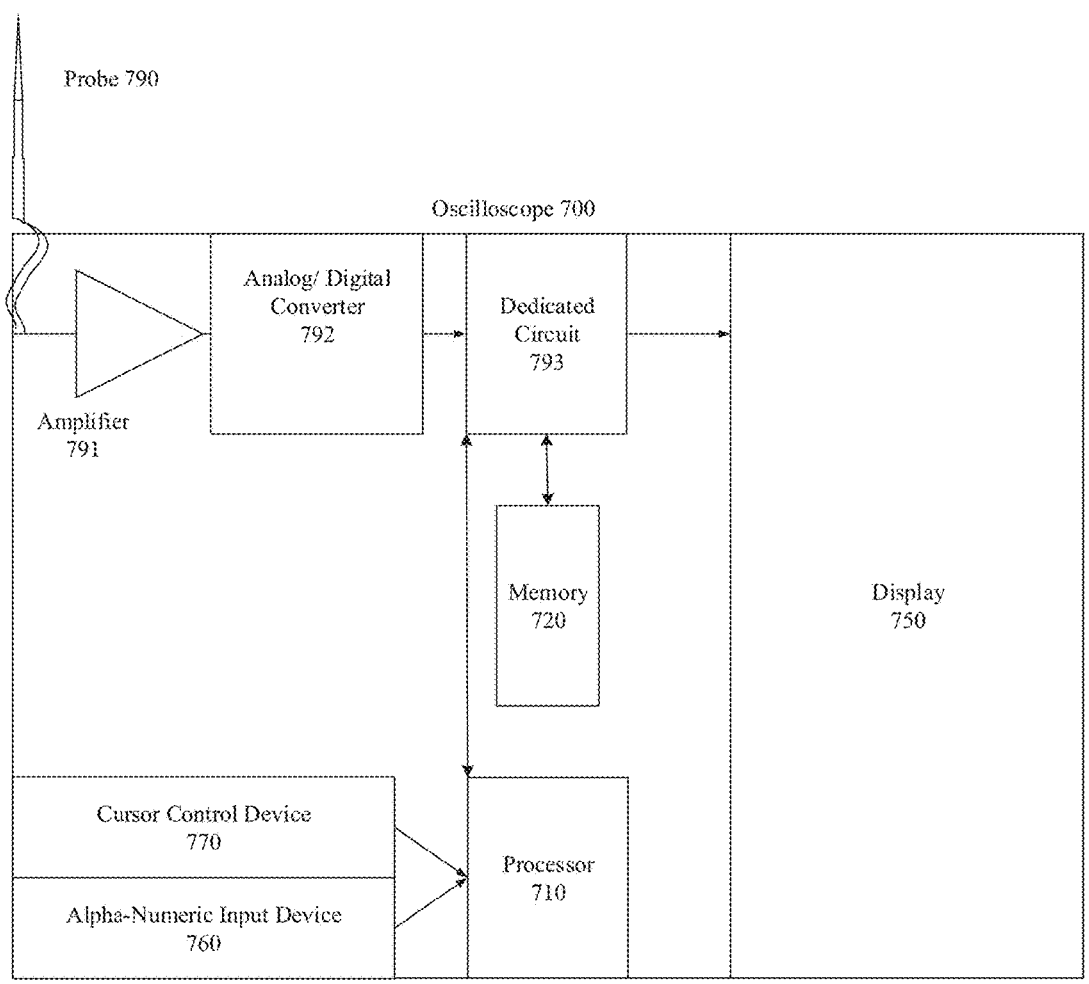
FIG. 7 is a representative overview of an oscilloscope with digital search triggering, in accordance with a representative embodiment.

FIG. 7 is a representative overview of the oscilloscope 700 with digital search triggering, in accordance with a representative embodiment. In FIG. 7, a probe 790 is used to detect a varying electronic signal. The probe 790 may include a clamp, a clip, or another mechanism to attach or otherwise directly connect the probe 790 to a transmission medium through which the varying electronic signal travels. The probe 790 may include one or more rigid measurement sensors at the end of a flexible tube. The probe 790 produces an analog signal representative of the measured varying electronic signal passing through the transmission medium.

The probe 790 is connected to an amplifier 791. The amplifier 791 and other components in FIG. 7 besides the probe 790 are internal components of the oscilloscope 700 casing. The amplifier 791 amplifies the analog signal received from the probe 790, and the amplified analog signal is passed to analog/digital converter 792. The analog/digital converter 792 digitizes the analog signal into a 2-dimensional digital signal. The 2-dimensional digital signal represents amplitude measurements over time, and is representative of, for example, voltage per milliseconds.

The analog/digital converter 792 may digitize an analog signal from the probe 790 out to the entire or substantially the entire acquisition bandwidth of the oscilloscope 700 with digital search triggering, and thus out to ~67 Gigabits and beyond currently. The digitizing is a function of a sampling rate, and if the sampling rate is not too high then the analog/digital converter 792 may be able to digitize analog signals on the entire bandwidth. However, if a high sampling rate is required, such as samples every 50 picoseconds or faster, then an analog/digital converter 792 may be restricted to digitizing signals on only a portion of the bandwidth. While mechanisms for dividing the bandwidth may vary, the analog/digital converter 792 may digitize analog signals in any portion of the bandwidth up to the acquisition limits of the oscilloscope 700 with digital search triggering.

A dedicated circuit 793 analyzes the 2-dimensional digital signal for the oscilloscope 700 with digital search triggering. The word "dedicated" as used herein means that the dedicated circuit 793 is dedicated substantially to analyzing the 2-dimensional digital signal, and is not merely a general-purpose processor used for a wide variety of tasks other than analyzing the 2-dimensional digital signal. As such, the analysis of the 2-dimensional digital signal is performed by hardware in this embodiment.

The dedicated circuit 793 performs two types of analysis of the 2-dimensional digital signal. The initial analysis is a continual analysis of the incoming 2-dimensional digital signal to search for vertical movement. That is, the initial analysis is to continually search for leading edges and falling edges in the 2-dimensional digital signal. When the leading edges or falling edges in the 2-dimensional digital signal are detected, the detection is considered a first trigger.

As described with respect to other embodiments, when the leading edge or falling edge is detected as a vertical movement, the 2-dimensional digital signal is reset to show a corresponding point in the leading edge or falling edge as the time origin (center) for the segment to be compared. The corresponding point may be a start of vertical movement, end of vertical movement, mid-point measured timewise, or mid-point measured using the amplitudes of the leading edge or falling edge. The resetting of the 2-dimensional digital signal may be performed by the dedicated circuit 793 in FIG. 7, or may be passed off to another processor (not shown).

A user provides predetermined parameters using the cursor control device 770 and/or alpha-numeric input device 760. The predetermined parameters are processed by a processor 710, and provided ultimately for storage in the memory 720 for use by the dedicated circuit 793. A cursor control device 770 may be a mouse or touch screen. An alpha-numeric input device may be a keyboard. Of course, as shown in FIG. 5, dials or similar rotary wheels can be used for inputting digital parameters. In FIG. 5, digital input devices 576*a*, 576*b*, 577*a*, 577*b* are used to input digital settings for analyzing a 2-dimensional digital signal.

In FIG. 7, the dedicated circuit 793 performs a "zone" analysis, even if the parameters from the user are input as analog parameters. That is, when the parameters are input as analog parameters, the dedicated circuit 793 performs zone auto-calculation processing to transform the analog parameters into corresponding time and vertical movement threshold minimums and maximums to search for in the incoming 2-dimensional signal. Of course, the parameters may be entered directly as digital parameters that include the time and vertical movement threshold minimums and maximums.

The parameters provided by a user are used to define one or multiple "zones" to search for in the incoming 2-dimensional digital signal. When the 2-dimensional digital signal is confirmed in the zone using the zone analysis, the confirmation is considered the second digital trigger. Upon confirmation of the second digital trigger, the appropriate segment of the 2-dimensional digital signal is displayed on the display 750 in FIG. 7.

In an embodiment, the probe 790 may be detecting and measuring what can be properly considered several different varying electronic signals. For example, different frequency portions of bandwidth provided by a transmission medium may be detected and measured, so that the oscilloscope 700 with digital search triggering is simultaneously searching for pulses or other characteristics of varying electronic signals at the same time on different frequency segments.

Additionally, as shown in FIGS. 3 and 4, the time scale of displayed segments is in the tens of nanoseconds. These displayed segments are held on the screen as still pictures, or video images moving much slower than the actual varying electronic signals being measured. Indeed, one might consider that a central purpose of any oscilloscope is to identify small portions of a varying electronic signal to isolate for viewing as stills or slow speeds, rather than continuously displaying the entire varying electronic signal in real-time at speeds at which a user cannot identify details like pulses. As noted, whatever the speeds at which segments of the 2-dimensional digital signal are displayed, the 2-dimensional digital signal is displayed on display 750.

Figure 8:
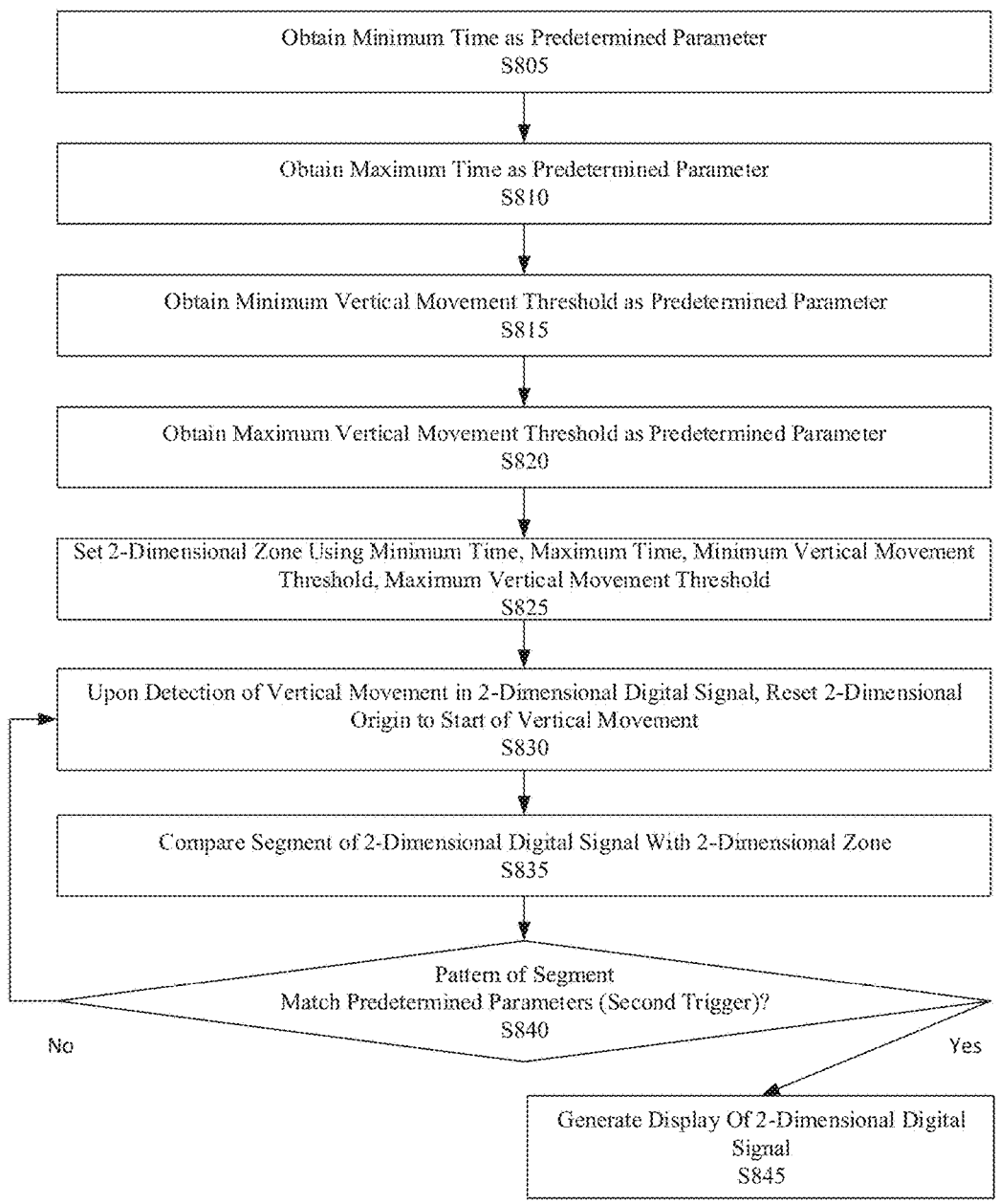
FIG. 8 is a representative view of a process for an oscilloscope with digital search triggering, in accordance with a representative embodiment.

FIG. 8 is a representative view of a process for the oscilloscope with digital search triggering, in accordance with a representative embodiment. In FIG. 8, a minimum time is obtained as a predetermined parameter at S805, and a maximum time is obtained as a predetermined parameter at S810. These two predetermined parameters are used later to define a 2-dimensional zone to compare with an incoming 2-dimensional digital signal as a second digital trigger.

At S815, a minimum vertical movement threshold is obtained from the user as a predetermined parameter, and at S820 a maximum vertical movement threshold is obtained from the user as a predetermined parameter. A vertical movement threshold may be, for example, a minimum level of positive or negative movement from an offset level, and a maximum vertical movement threshold may be a maximum level of positive or negative movement from an offset level. The offset level may be, for example, a default or steady-state level of the transmission medium in the absence of a pulse. These two predetermined parameters are also used later to define a 2-dimensional zone to compare with an incoming 2-dimensional digital signal as a second digital trigger. As noted previously, multiple such zones can be defined, so that a user can search for pulses or other characteristics in a 2-dimensional signal at several different places relative to a defined origin.

At S825, the 2-dimensional zone is set using the minimum time, maximum time, minimum vertical movement threshold, and maximum vertical movement threshold obtained at S805, S810, S815 and S820. The oscilloscope with digital search triggering used for the method in FIG. 8 may be continually detecting the varying electronic signal whenever, for example, the oscilloscope with digital search triggering is on and the probe is in use to detect such a varying electronic signal passing through a medium. Additionally, the oscilloscope with digital search triggering used for the method in FIG. 8 may be continuously digitizing the analog signal produced by the probe of the oscilloscope with digital search triggering. The digitized data is the 2-dimensional digital signal described herein, and may include a full set of data reproducible on a monitor for storage in a memory, and a less detailed set of digitized data that is continuously analyzed for vertical movement while the oscilloscope with digital search triggering is in use.

At S830, upon detection of vertical movement in a 2-dimensional digital signal, the 2-dimensional origin is reset to the start of the detected vertical movement. Thus, the segment to be compared is centered based on the location of the detected vertical movement. The detection of vertical movement is the first trigger in FIG. 8, and results in an attempt to see if the 2-dimensional digital signal meets a zone as defined by the user at S825.

At S835, a segment of the 2-dimensional digital signal centered based on the location of the detected vertical movement as the origin is compared with a 2-dimensional zone defined by the user. At S840, a determination is made as to whether the pattern of the segment matches predetermined parameters defining the zone. An affirmative determination at S840 is the second trigger in FIG. 8. If the pattern of the segment matches the predetermined parameters, (S840=Yes), the display of the 2-dimensional digital signal is generated at S845. If the pattern of the segment does not match the predetermined parameters (S840=No), the process returns to S830 to wait for detection of vertical movement in the 2-dimensional digital signal.

Accordingly, the oscilloscope with digital search triggering enables trigger use over oscilloscope bandwidths beyond 3 Gigahertz and beyond bandwidth limitations of an analog trigger system, including an analog trigger system that may still be provided as an option for alternative use in the oscilloscope with digital triggering. The oscilloscope with digital search triggering allows triggering to substantially the entire acquisition bandwidth of existing oscilloscopes. Such triggering allows users to configure relatively-complex analog-like triggers with input signal frequency content for substantially the entire acquisition bandwidth of the oscilloscope with digital search triggering. This acquisition bandwidth will soon exceed 100 Gigahertz for real-time oscilloscopes, and the digital triggering described herein will provide the ability to set triggers for substantially the entire frequency range.

Although the oscilloscope with digital search triggering has been described with reference to several exemplary embodiments, it is understood that the words that have been used are words of description and illustration, rather than words of limitation. Changes may be made within the purview of the appended claims, as presently stated and as amended, without departing from the scope and spirit of oscilloscope with digital search triggering in its aspects. Although oscilloscope with digital search triggering has been described with reference to particular means, materials and embodiments, oscilloscope with digital search triggering is not intended to be limited to the particulars disclosed; rather oscilloscope with digital search triggering extends to all functionally equivalent structures, methods, and uses such as are within the scope of the appended claims.

For example, the present disclosure describes a hardware zone trigger. The hardware zone trigger 250 for a real-time oscilloscope with digital search triggering may be provided with the oscilloscope with digital search triggering, or may be provided as an upgrade option. Either way, the hardware zone trigger 250 allows the user to draw shapes ("zones") in the waveform display area of the oscilloscope screen. The zones specify parameters which a 2-dimensional digital signal must intersect or must-not intersect in order to initiate the second trigger, such as at S140 in FIG. 1. The user may draw several such zones to set intricate conditions as triggers. The present disclosure describes mainly minimum and maximum time and minimum and maximum vertical movement threshold. Nevertheless, numerous additional characteristics of a varying electronic signal can be detected (measured) and used for triggering the oscilloscope with digital search triggering.

Additionally, the present disclosure describes detection of edges in the singular. However, the oscilloscope with digital search triggering described herein may produce analog signals based on varying electronic signals on multiple channels (e.g., four channels), and may produce multiple displays (e.g., five separate displays) of multiple 2-dimensional digital signals that generate both the first trigger and the second trigger described herein.

Although the present specification describes components and functions that may be implemented in particular embodiments with reference to particular standards and protocols, the disclosure is not limited to such standards and protocols. Such standards are periodically superseded by more efficient equivalents having essentially the same functions. Accordingly, replacement standards and protocols having the same or similar functions are considered equivalents thereof.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

According to an aspect of the present disclosure, the oscilloscope with digital search triggering includes a probe and an analog to digital converter. The probe detects a varying electronic signal and produces an analog signal based on the varying electronic signal detected. An analog to digital converter converts the analog signal to a digital signal. The oscilloscope with digital search triggering performs a process that includes detecting vertical movement of the digital signal as a first digital trigger triggered at a trigger time. The process also includes comparing a segment of the digital signal set based on the trigger time with predetermined parameters for the varying electronic signal received from a user to confirm whether a pattern of the varying electronic signal in the segment matches the predetermined parameters. When the pattern of the varying electronic signal in the segment matches the predetermined parameters, the process includes generating a display showing the varying electronic signal in the segment based on the trigger time.

According to another aspect of the present disclosure, the varying electronic signal is detected substantially to the full range of the oscilloscope with digital search triggering and beyond 20 Gigahertz.

According to yet another aspect of the present disclosure, the vertical movement is a leading edge of the varying electronic signal or a falling edge of the varying electronic signal.

According to still another aspect of the present disclosure, the predetermined parameters are for a pulse and include a minimum amount of duration for the pulse and a minimum vertical movement threshold for the pulse.

According to another aspect of the present disclosure, the display is generated in real time while the varying electronic signal is still being detected.

According to yet another aspect of the present disclosure, comparing is performed by a dedicated circuit adapted for the comparing.

According to still another aspect of the present disclosure, the dedicated circuit includes a hardware resource of the oscilloscope with digital search triggering.

According to another aspect of the present disclosure, the dedicated circuit includes at least one of an application specific integrated circuit (ASIC) and a field programmable gate array (FPGA).

According to yet another aspect of the present disclosure, predetermined parameters are preset by the user as analog parameters for an analog trigger.

According to still another aspect of the present disclosure, the predetermined parameters are preset by the user as digital parameters for a second digital trigger.

According to another aspect of the present disclosure, the digital parameters are set using a graphical plot of time versus amplitude that allows a user to set a zone defined by minimum time and maximum time and a minimum vertical movement threshold and a maximum vertical movement threshold. The second digital trigger is generated based on whether the varying electronic signal passes a zone boundary.

According to still another aspect of the present disclosure, the digital parameters include multiple zones defined by minimum times and maximum times and minimum vertical movement thresholds and maximum vertical movement thresholds.

According to yet another aspect of the present disclosure, detecting and comparing are performed independent of an analog triggering capability of the oscilloscope with digital search triggering.

According to another aspect of the present disclosure, the oscilloscope with digital search triggering is adapted to provide a selectable option of the analog triggering capability in lieu of the detecting and comparing.

According to an aspect of the present disclosure, an operational method for the oscilloscope with digital search triggering includes detecting a varying electronic signal and producing an analog signal set based on the varying electronic signal detected. The method includes converting the analog signal to a digital signal, and detecting vertical movement of the digital signal as a first digital trigger triggered at a trigger time. A segment of the digital signal set based on the trigger time is compared with predetermined parameters for the varying electronic signal received from a user to confirm whether a pattern of the varying electronic signal in the segment matches the predetermined parameters. When the pattern of the varying electronic signal in the segment matches the predetermined parameters, the method includes generating a display showing the varying electronic signal in the segment based on the trigger time.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

The invention claimed is:

1. An oscilloscope, comprising:
a probe that detects a varying electronic signal and produces an analog signal set based on the varying electronic signal detected;
an analog to digital converter that converts the analog signal to a digital signal; and
circuitry adapted to detect vertical movement of the digital signal as a first digital trigger triggered at a trigger time, compare a segment of the digital signal set based on the trigger time with predetermined parameters for the varying electronic signal received from a user to confirm whether a pattern of the varying electronic signal in the segment matches the predetermined parameters, and when the pattern of the varying electronic signal in the segment matches the predetermined parameters, generate a display showing the varying electronic signal in the segment based on the trigger time.

2. The oscilloscope of claim 1,
wherein the comparing is performed by a dedicated circuit adapted for the comparing.

3. The oscilloscope of claim 2,
wherein the dedicated circuit comprises a hardware resource of the oscilloscope.

4. The oscilloscope of claim 3,
wherein the dedicated circuit comprises at least one of an application specific integrated circuit (ASIC) and a field programmable gate array (FPGA).

5. The oscilloscope of claim 1,
wherein the predetermined parameters are preset by the user as digital parameters for a second digital trigger,
wherein the digital parameters are set using a graphical plot of time versus amplitude that allows a user to set a zone defined by minimum time and maximum time and a minimum vertical movement threshold and a maximum vertical movement threshold, and
wherein the second digital trigger is generated based on whether the varying electronic signal passes a zone boundary.

6. The oscilloscope of claim 5,
wherein the digital parameters comprise a plurality of zones defined by minimum times and maximum times and minimum vertical movement thresholds and maximum vertical movement thresholds.

7. The oscilloscope of claim 1,
wherein, the varying electronic signal is detected substantially to a full range of the oscilloscope and beyond 20 Gigahertz.

8. The oscilloscope of claim 1,
wherein the vertical movement is a leading edge of the varying electronic signal or a falling edge of the varying electronic signal.

9. The oscilloscope of claim 1,
wherein the predetermined parameters are for a pulse and include a minimum vertical movement threshold for the pulse, and at least one of a minimum amount of duration for the pulse and a maximum amount of duration for the pulse.

10. The oscilloscope of claim 1,
wherein the display is generated in real time while the varying electronic signal is still being detected.

11. The oscilloscope of claim 1,
wherein the predetermined parameters are preset by the user as analog parameters for an analog trigger.

12. An operational method for an oscilloscope, comprising:
detecting a varying electronic signal and producing an analog signal set based on the varying electronic signal detected;
converting the analog signal to a digital signal,
detecting vertical movement of the digital signal as a first digital trigger triggered at a trigger time;
comparing a segment of the digital signal set based on the trigger time with predetermined parameters for the varying electronic signal received from a user to confirm whether a pattern of the varying electronic signal in the segment matches the predetermined parameters; and
when the pattern of the varying electronic signal in the segment matches the predetermined parameters, generating a display showing the varying electronic signal in the segment based on the trigger time.

13. The operational method of claim 12,
wherein, the varying electronic signal is detected substantially to a full range of the oscilloscope and beyond 20 Gigahertz.

14. The operational method of claim 12,
wherein the vertical movement is a leading edge of the varying electronic signal or a falling edge of the varying electronic signal.

15. The operational method of claim 12,
wherein the predetermined parameters are for a pulse and include a minimum vertical movement threshold for the pulse, and at least one of a minimum amount of duration for the pulse and a maximum amount of duration for the pulse.

16. The operational method of claim 12,
wherein the display is generated in real time while the varying electronic signal is still being detected.

17. The operational method of claim 12,
wherein the comparing is performed by a dedicated circuit adapted for the comparing.

18. The operational method of claim 12,
wherein the predetermined parameters are preset by the user as analog parameters for an analog trigger.

19. The operational method of claim 12,
wherein the detecting and comparing are performed independent of an analog triggering capability of the oscilloscope.

* * * * *